May 19, 1970 B. BOSSARD ET AL 3,513,398

BALANCED MIXER CIRCUITS

Filed Jan. 27. 1966 2 Sheets-Sheet 1

INVENTORS
BERNARD B. BOSSARD &
SHUI YUAN

BY Edward J. Norton
Attorney

BALANCED MIXER CIRCUITS

Filed Jan. 27, 1966

2 Sheets-Sheet 2

INVENTORS
BERNARD B. BOSSARD &
SHUI YUAN
BY Edward J Norton
Attorney

United States Patent Office 3,513,398
Patented May 19, 1970

3,513,398

BALANCED MIXER CIRCUITS

Bernard Bossard, Livingston, and Shui Yuan, North Brunswick, N.J., assignors to RCA Corporation, a corporation of Delaware Filed Jan. 27, 1966, Ser. No. 523,417
Int. Cl. H04b 1/26
U.S. Cl. 325—446 8 Claims

ABSTRACT OF THE DISCLOSURE

A circuit for mixing a signal of a first frequency with a signal of a second frequency in the presence of an inband interfering signal is provided. The circuit includes two devices which when biased in a predetermined manner exhibit different non-linear reactance versus voltage or current characteristics such that when combined provide at the output a desired difference frequency signal and cancellation of even order harmonics and distortion products of said interfering signal.

This invention relates to signal mixing circuits and more particularly to a balanced mixer circuit in which all odd and even order intermodulation and cross modulation products are inherently non-existent.

Cross modulation and intermodulation distortion in mixers are a result of the non-linearity of the device utilized in the mixer and the non-linearity caused by saturation of the mixer, and hence, cannot be reduced by conventional means of shielding and filtering. Ground receivers operating in dense electromagnetic radiation environments and relay satellites transmitting or receiving several channels of information are extremely susceptible to this form of co-channel crosstalk. It is known in the prior art that any push-pull or balanced mixer circuit will reduce the odd harmonics of the local oscillator or pump frequency, and thus reduce the odd order distortion products. However, according to the prior art, the even order harmonics and distortion products cannot be reduced by conventional means without reducing the desired output signal.

The present invention has as one of its objects to provide an improved balanced mixer capable of substantially reducing even order harmonic and distortion products.

It is another object to provide an efficient, improved balanced mixer which reduces even order harmonic products without substantially reducing the signal desired.

It is another object to provide an even order, improved balanced mixer using selected non-linearity coefficients of the devices employed.

These and other objects are achieved in one embodiment of the invention by placing two voltage variable capacitance diode devices or varactors, in a balanced configuration. The varactors employed have non-linearity or gamma coefficients designated, respectively, as $\gamma 1$ and $\gamma 2$. By injecting a first frequency, a second interfering frequency and the local oscillator frequency as a third frequency to both varactors, the harmonic coefficients influencing the total distortion undergo a phase reversal, which reversal is a function of the different gamma coefficients $\gamma 1$ and $\gamma 2$ of the varactors employed. The beat frequency signals from each varactor are then collected, whereby an output signal, which is substantially free of cross modulation and even order intermodulation distortion due to the interfering frequency, is obtained.

Figures 1, 2, 3, 4:
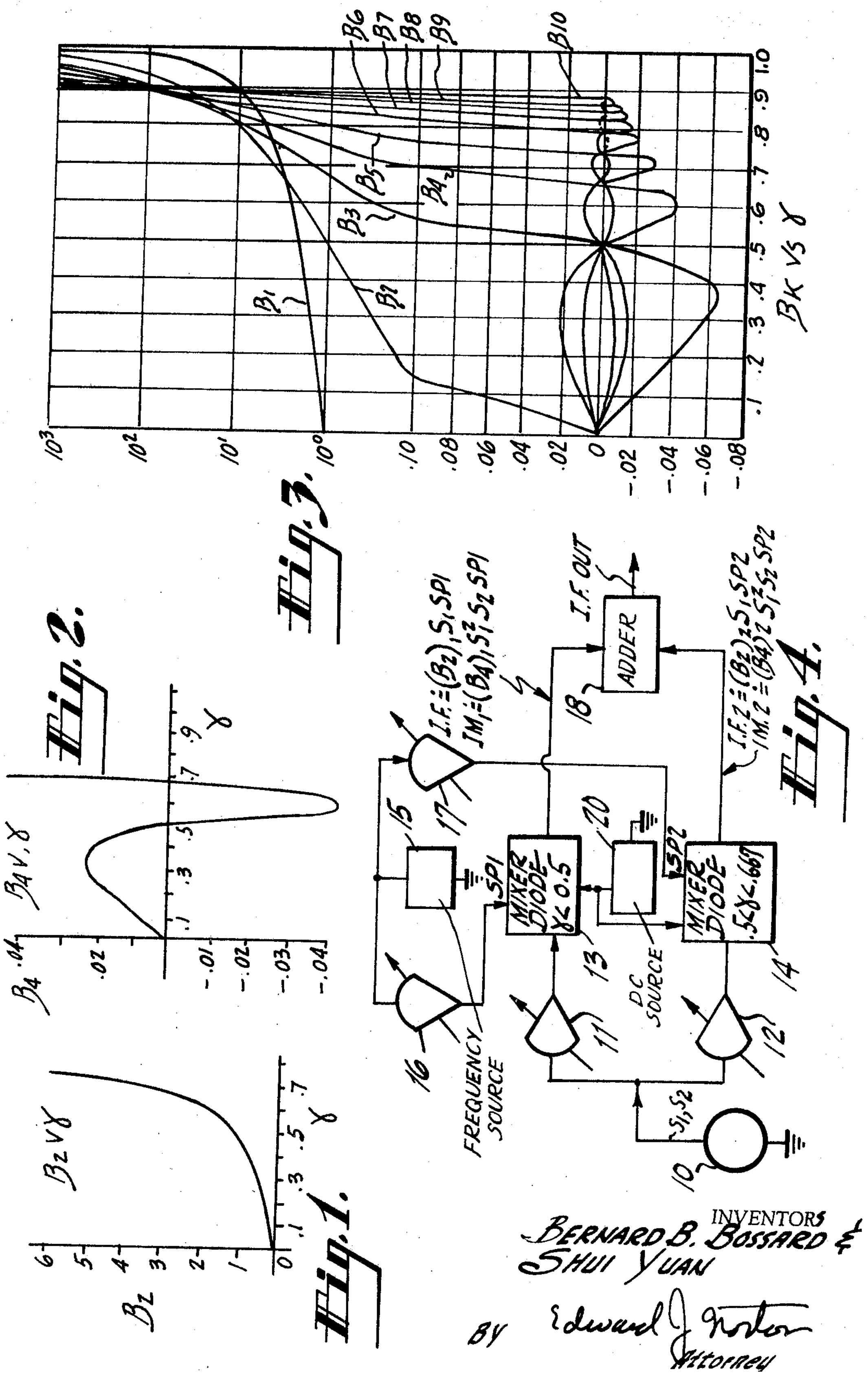
Figure 5:
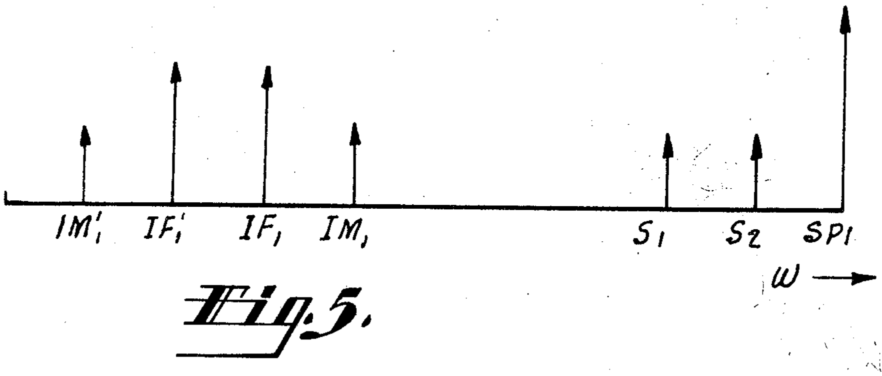
Figure 6:
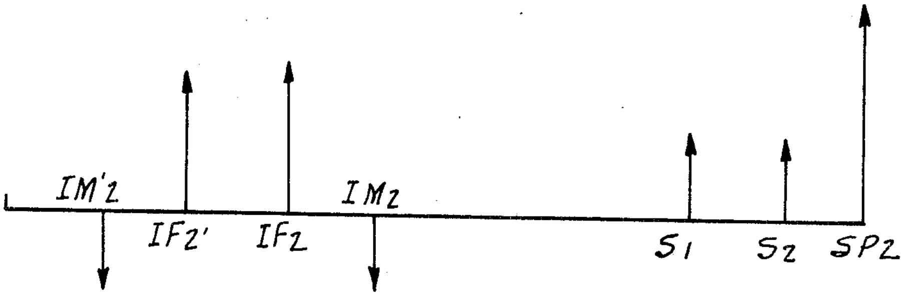
Figure 7:
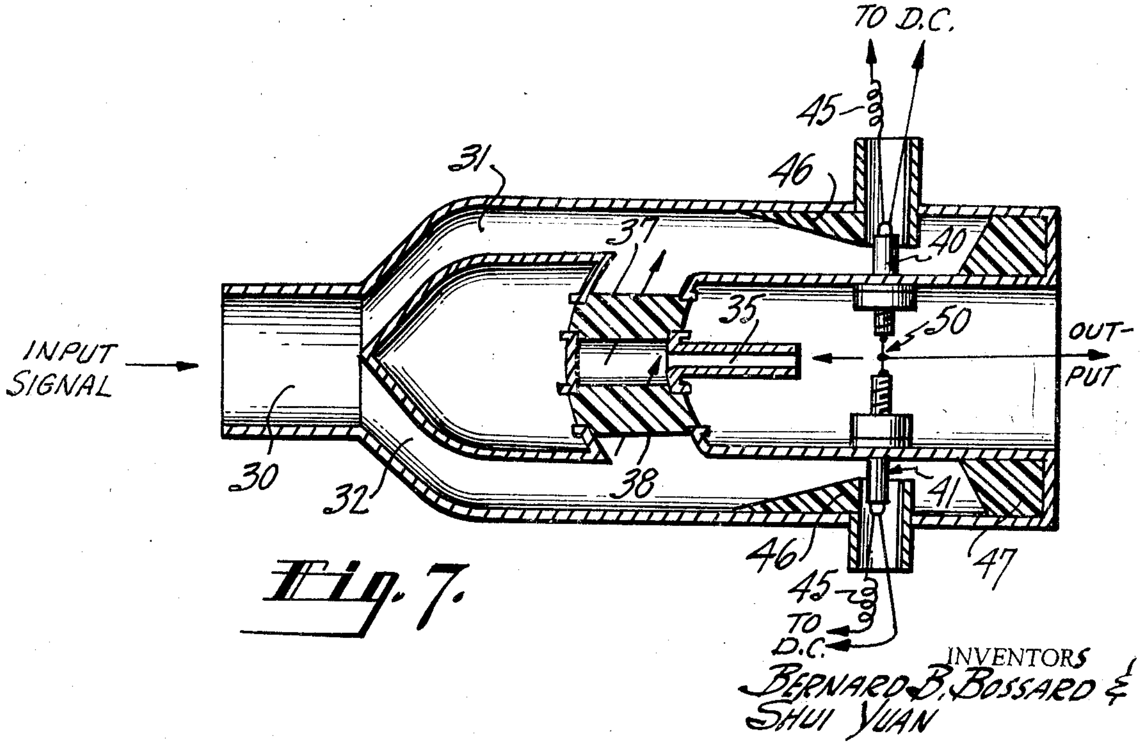

In order that the invention may be more clearly understood, it will be described in detail with reference to the accompanying drawing in which:

FIG. 1 is a graph of the non-linearity coefficient of a varactor versus the squared term coefficient of a Taylor expansion, FIG. 2 is a graph of the non-linearity coefficient of a varactor versus the fourth term coefficient of a Taylor expansion, FIG. 3 is a graph of the non-linearity coefficent of a varactor versus higher order term coefficients, such as the sixth, eighth, and so on, of a Taylor expansion, FIG. 4 is a block diagram of a mixer presented to aid in understanding the operation of the invention, FIG. 5 is a diagram of the major intermediate and intermodulation frequency components in a typical mixer, FIG. 6 is a diagram of the major intermediate and intermodulation frequency components showing a reversal due to the non-linearity coefficient, and FIG. 7 is a transverse sectional view of a mixer circuit constructed according to one embodiment of this invention.

Before discussing specific embodiments of the invention, it will be helpful to develop some general principles governing the operation of the device.

Mixing is basically the result of second order non-linearity and is primarily related to the squared term coefficient of a Taylor expansion, defined as $B_2$. Similarly the fourth order intermodulation and cross modulation products are determined by a fourth term coefficient of a Taylor expansion defined as $B_4$. Higher even order intermodulation and cross modulator products are determined by higher even term coefficients of a Taylor expansion defined as $B_6$, $B_8$, and so on. In a resistive mixer, whether it be exponential or a power law device, all terms in the Taylor expansion or Taylor series have positive coefficients, independent of the non-linearity coefficient of the resistive or active device. Thus if $B_4$, $B_6$, and so on, were reduced by means of a balancing network, this would result in a reduction of $B_2$, which is the desired term's coefficient. The varactor diode, however, has a non-linearity characteristic given by $$C(V)=\frac{C_0}{(V_0+\phi)}\gamma \quad (1)$$

where $C(V)$=junction capacity value shown as a function of voltage (microfarads)

$C_0$=junction capacitance at $(V_0+\phi)$ equals one volt (microfarads)

$V_0$=total applied voltage across the varactor (volts)

$\gamma$=non-linearity coefficient=gamma coefficient $\phi$=contact potential of the junction (volts)

The voltage charge relationship of the non-linear capacitance can be expressed in the following functional form:

$$V=V(Q) \quad (2)$$

The above Equation 2 indicates that the voltage V across the varactor is a function of the charge Q. The dual of 2 is also true and the charge can be expressed as a function of voltage namely:

$$Q=Q(V) \quad (3)$$

The charge across the variable capacitor can be shown to be equal to:

$$Q_c=Q_0(1+q) \quad (4)$$

$Q_c$=charge across the variable capacitor (coulombs)

$Q_0$=charge at quiescent operating point (coulombs)

$q$=normalized variable component of the charge (coulombs)

Similarly the voltage is expressed as $$V_c=V_0(1+V) \quad (5)$$

$V_c$=voltage across the variable capacitance (volts)
$V_0$=voltage at the quiescent operating point (volts)
$V$=normalized variable component of the voltage (volts)

If Equation 2 now expanded is in a Taylor series about the zero signal operating point the result is $$V(Q)=V_0(1+B_1q+B_2q^2+ \ldots +B_nq^n- \ldots) \quad (6)$$

where $$B_k=\frac{Q_0K}{V_0K!}\frac{d^ky}{dQ^k} \quad (7)$$

K=any positive integer

For a varactor diode with a non-linearity capacity characteristic as expressed in Equation 1, the $B_k$'s, (i.e., $B_1$, $B_2 \ldots B_n$) can be evaluated from Equation 6. And the general expression is:

$$B_k=\frac{1}{K!}\left(\frac{1}{1-\gamma}\right)\left(\frac{1}{1-\gamma}-1\right)\left(\frac{1}{1-\gamma}-2\right)\cdots\left(\frac{1}{1-\gamma}-k+1\right)$$

If reference is made to FIG. 1 there is shown a graph of the squared term coefficient $B_2$ versus the non-linearity coefficient or the gamma coefficient. It can be seen from the graph of FIG. 1 that the squared term $B_2$ is positive for all values of gamma. If reference is now made to the graph of FIG. 2, it can be seen that the fourth order term $B_4$ is positive for all values of $\gamma$ less than 0.5 and becomes negative for values of gamma greater than 0.5 but less than 0.667. Similarly, if reference is now made to FIG. 3, it can be seen that all the higher even order coefficients $B_6$, $B_8$, and so on, for all values of $\gamma$ less than 0.5 have a reverse in sign when compared with $B_6$, $B_8$, and so on, for $\gamma$ greater than 0.5 but less than 0.667. Hence, if two varactor diodes are used in a balanced configuration and the diodes are chosen such that one has a gamma coefficient less than 0.5 and the other possesses a gamma coefficient greater than .5 and less than .667 the fourth, the sixth, the eighth, and so on, order terms can be cancelled out by controlling the signal and oscillator frequency applied to the diodes. This is so because a reversal in sign is inherent at these higher orders for a gamma coefficient greater than .5 but less than .667.

If reference is made to FIG. 4, a block diagram of a mixer utilizing these principles is shown. Reference numeral 10 refers to a source of signal potentials. The output of source 10 is coupled to two buffer stages 11 and 12. Source 10 may be the output of a radio frequency stage of a receiver, or the output of an antenna, or may be a source of frequency such as an oscillator. Assume the output of 10 contains a desired signal referred to as $S_1$ and an in-band interfering signal denoted as $S_2$, where $S_2$ might be a true interfering signal or a signal due to some distortion products of the potential source 10. The output of source 10 is coupled to the buffers 11 and 12 which are shown to be variable in order to control the amplitude or phase of the signal to be applied to the mixer diode stages 13 and 14 in order to achieve perfect cancellation of the fourth order distortion components. Such elements as 11 and 12 may be amplifiers with gain control or attenuators as variable resistors, capacitors. In order to achieve mixing of $S_1$, another frequency source 15 is shown. Source 15 may be the local oscillator stage of a receiver or a pump stage having a frequency which will mix with the input frequencies from the buffers 11 and 12 to produce the desired beat frequency. The source 15 is shown coupled to two other buffer stages 16 and 17. Stages 16 and 17's outputs can also be controlled in magnitude or phase to provide the proper signal levels to the mixer stages 13 and 14 to produce cancellation of the unwanted frequency terms. Such buffer stages as 16 and 17 are similar in nature to those described for buffers 11 and 12.

Assume that the signal magnitude from buffer 16 into mixer 13 is $Sp1$ and the signal level from buffer 17 into mixer 14 is $Sp2$. Under these conditions, due to the presence of the interfering frequency $S_2$, the output of the mixers 13 and 14 will contain a desired component and an interfering component. The desired component might be the intermediate frequency or I.F. of the receiver. Therefore the output of mixer 13 shows an I.F. component whose magnitude contains a $B_2$ term and an $S_1S_{p1}$ term representing the magnitudes of the local oscillator and signal frequency levels. This component will be a positive term because the $\gamma$, gamma coefficient, of the varactor diode used in the mixer is less than .5 and from the graph of FIG. 1 all the squared term coefficients will be positive. There will also be present a distortion or intermodulation component due to the spurious frequency $S_2$. This is shown at the output of mixer 13 as $I.M._1$ and is composed of components due to the fourth order term coefficient ($B_4$), $S_1^2$, the square of the signal frequency, $S_2$, the interfering frequency and $Sp1$, the local oscillator frequency. ($B_4$), will also be positive for a varactor diode having a gamma coefficient of less than 0.5 as seen from the graph of FIG. 2. If reference is now made to FIG. 5, it can be seen that when the mixer is injected with the signal $S_1$, the in-band interfering signal $S_2$, and the local oscillator $Sp1$, the output of the mixer will consist of the desired intermediate frequency $IF_1$, the undesired intermediate frequency $IF'_1$, the distortion terms, namely the intermodulation frequencies $IM_1$ and $IM'_1$. All four output frequency components are in phase because $B_2$ and $B_4$ have the same sign.

If the same frequency signals but of different amplitude and or phase, are routed to a varactor diode mixer 14 with a gamma coefficient between 0.5 and 0.667, the mixer 14 will also have a $B_2$ coefficient output at the intermediate frequency $IF_2$ and a $B_4$ coefficient output at the intermodulation frequency $IM_2$. However, it can be seen from FIG. 2 that such a varactor will cause the $B_4$ term to undergo a phase reversal whereby the $IM_2$ term will have an opposite sign to the $IM_1$ term produced by the other diode mixer 13. If reference is now made to FIG. 6, it can be seen that when mixer 14 is subjected to the signal $S_1$, the in-band interfering signal $S_2$, and the local oscillator signal $Sp2$, the output of the mixer 14 will consist of the desired intermediate frequency $IF_2$, the undesired intermediate frequency $IF'_2$, the distortion terms, namely, the intermodulation frequencies $IM_2$ and $IM'_2$. The output frequency components of mixer 14 differ from that of mixer 13 in that the intermodulation frequencies, $IM_2$ and $IM'_2$, have an opposite polarity to the intermediate frequency components $IF_2$ and $IF'_2$. This is due to the opposite polarities of $B_2$ and $B_4$. Hence if the signals from the mixers 13 and 14 are combined or added in an adder circuit 18, which may be a resistor adder, a transistor, vacuum tube, waveguide or other adder, the output would be at the intermediate frequency and of a magnitude determined by the sum of $IF_1$ and $IF_2$. Therefore, if the magnitudes of the signal and local oscillator frequencies are properly adjusted to each of the different gamma coefficient varactors, the fourth order term can be made to cancel by the very nature of the different gamma coefficients of the varactor diodes. Similarly, the fourth order cross-modulation distortion terms can also be made to cancel out completely. This of course is desirable as it serves to increase the noise immunity of the receiving system and minimizes the problem of filtering at the output of the mixer.

The above discussion confined itself to the problem of cancelling out the fourth order term which is the predominant interfering contributing portion of the mixer's spectrum. If reference is made to FIG. 3 there is shown a series of graphs showing the inversion of the nonlinearity coefficient $\gamma$ for various values of $B_k$, where $k$=any positive integer. If proper values of gamma are selected it can be seen that higher order terms as $B_5$, $B_6$, $B_7$, $B_8$, and so on, can also be balanced out in the same manner. The important point being that the non-linearity coefficient exhibits this reversal and by controlling the amplitude and phase of the signal injected on the varactor mixers, such cancellation will be accomplished readily. In order to further enhance the effect of eliminating intermodulation distortion products, there is shown a D.C. source of potential 20, which serves to bias the varactor diodes at an optimum point on their voltage capacitance characteristic curve, so the quiescent operating points are properly chosen. The D.C. bias point furnished from source 20, could also have separate adjustments for each of the varactor diodes enabling one to make the most efficient use of the component's gamma coefficient.

If reference is made to FIG. 7, there is shown a high frequency mixer according to the invention. A signal to be mixed is caused to propagate in the signal input portion of a waveguide 30. The input signal, which may be from an antenna or from a R.F. stage of a microwave receiver, is caused to split into the two waveguide arms designated as 31 and 32. There is also an input port 35 for the local oscillator or pump signal. The local oscillator signal is introduced into the waveguide arms 31 and 32 through attenuator elements 37 and 38. Elements 37 and 38 are used to adjust the local oscillator voltage to the proper level in order to obtain the most efficient mixer operation. The attenuators 37 and 38 may be composed of ferrite, dielectric or any other conventional microwave attenuator. Also mounted in the respective arms 31, 32 of waveguide 30 are two varactors 40 and 41. The varactors are chosen so that they have gamma coefficients according to the previous description. Hence varactor diode 40 may have a gamma coefficient of less than .5 and varactor diode 41 has a gamma coefficient between .5 and .667. Varactor 40 could be a graded junction varactor. Such graded junction varactors have a linear impurity doping profile and have gamma of .33. Or varactor 40 may have a square type impurity profile giving a so-called abrupt junction and have a gamma coefficient of approximately 0.5. In this case varactor 41 would be a negative-gradient, reverse graded or retro-graded junction. Such junctions have gamma coefficients of greater than 0.5 and are referred to as hyper-abrupt varactor diodes. It can be seen that due to the balanced configuration varactor 40 could be exchanged with 41 and one need only adjust the attenuators properly, thereby controlling the signal to the respective diode. There is also shown two leads from each diode labeled "to D.C." These leads go to a source of D.C. potential to furnish a proper operating bias on each of the diodes 40 and 41. The bias is used in order to adjust to the most efficient operating point and to insure that the non-linearity coefficient at that point is the value necessary for proper operation. There is shown an element 45 in series with one of the leads going to the D.C. source. This element 45 could be an inductor to prevent spurious frequencies from the D.C. source interfering with mixing operation and to prevent signals from the diodes 40 and 41 from coupling back to the D.C. supply. Also shown in the waveguide are two tapered sections 46, which serve to match the impedance of the diode to the signal and local oscillator sources. Such matching techniques by using tapered sections are known in the art and are not considered as part of this invention. There is shown two terminating sections 47, which are shown for broadband operation. For narrow band operation, the termination 47 could be replaced by a tunable short. Such elements 47 are also known in the art and are not part of this invention. The output of the diodes 40 and 41 are taken from a common point 50, which may be the junction point of the varactor diode's cathodes or anodes, depending on the D.C. bias employed or the type of varactor diodes used.

What is claimed is:

1. A circuit for mixing a signal of a first frequency with a signal of a second frequency in the presence of an in-band interfering frequency signal comprising, (a) a first and a second varactor diode each having an input and an output terminal and having materially different gamma coefficients of $\gamma 1$ and $\gamma 2$, the gamma coefficient $\gamma 1$ and $\gamma 2$ each being defined by the formula $$C(V)=\frac{C_0}{(V_0+\phi)}\gamma$$

where

C(V)=junction capacity value shown as a function of voltage (microfarads)

$C_0$=junction capacitance at $(V_0+\phi)$ equals one volt (microfarads)

$V_0$=total applied voltage across the varactor (volts)

$\gamma$=non-linearity coefficient=gamma coefficient $\phi$=contact potential of the junction (volts)

(b) means for coupling said signal of said first frequency to said input terminal of said first and said second diode, (c) means for coupling said signal of said second frequency including energy of said interfering frequency to said input terminal of said first and said second diode to cause mixing by said diodes at said first and second frequencies in the presence of said interfering frequency, (d) output means for deriving from said output terminal of said first and said second diode an output signal of desired frequency, (e) the gamma coefficient $\gamma 1$ of said first diode and the different gamma coefficient $\gamma 2$ of said second diode being determined to cause said diodes to produce said ouput signal at said output means substantially free of even order harmonics and distortion products of said interfering frequency.

2. A circuit for mixing according to claim 1 where said first varactor diode has a gamma coefficient $\gamma 1$ of less than 0.5, and where said second varactor diode has a gamma coefficient $\gamma 2$ between 0.5 and 0.667.

3. A circuit for mixing a signal of a first frequency with a signal of a second frequency in the presence of an in-band interfering frequency signal comprising (a) a first non-linear device having an input and an output terminal and when biased in a predetermined manner exhibiting a first non-linear reactance versus voltage or current characteristic, (b) a second non-linear device having an input and an output terminal and when biased in a predetermined manner exhibiting a second different non-linear reactance versus voltage or current characteristic, (c) means for coupling said signal of said first frequency to said input terminal of said first and said second device, (d) means for coupling said input terminals of each of said first and second devices to a point of biasing potential, (e) means for coupling said signal of said second frequency including energy of said interfering frequency to said input terminals of said first and second device to cause mixing by said devices of said first and second frequencies, said first and said second devices nonlinear reactance versus voltage or current characteristics being selected to provide cancellation of even order harmonic and distortion products of said interfering frequency.

4. A mixer for deriving beat frequency signal currents from two sources of alternating current having a frequency difference comprising (a) first and second non-linear capacity diodes each having an input and an output terminal and having materially different gamma coefficients of $\gamma 1$ and $\gamma 2$, the gamma coefficients being defined by the formula $$C(V)=\frac{C_0}{(V_0+\phi)}\gamma$$

where

C(V)=junction capacity value shown as a function of voltage (microfarads)

$C_0$=junction capacitance at $(V_0+\phi)$ equals one volt (microfarads)

$V_0$=total applied voltage across the varactor (volts)

$\gamma$=non-linear coefficient=gamma coefficient $\phi$=contact potential of the junction (volts)

(b) a first buffer having an input and output terminal, (c) means coupling said first buffer's output terminal to said input terminal of said first diode, (d) a second buffer having an input and output terminal, (e) means coupling said second buffer's output terminal to said input terminal of said second diode, (f) a source of alternating current at a first frequency, (g) means coupling said input terminals of said first and second buffers to said source, (h) a second source of alternating current at a second frequency different from said first frequency, (i) means for coupling said input terminals of said first and second diodes to said second source to operate said diodes to each produce beat frequency currents determined by said first and second frequencies, (j) output means coupled to said output terminals of said first and said second diodes to derive a desired beat frequency current from said beat frequency currents produced by said diodes, (k) the gamma coefficient $\gamma 1$ of said first diode and the different gamma coefficient $\gamma 2$ of said second diode being determined to cause said diodes to produce said desired beat frequency current at said output means substantially free of even order harmonics and other distortion products.

5. A circuit for mixing power at a first frequency with a signal at a second frequency in the presence of an interfering signal comprising:

(a) first and second varactor diodes having different gamma coefficients of $\gamma 1$ and $\gamma 2$, the gamma coefficients being defined by $$C(V)=\frac{C_0}{(V_0+\phi)}\gamma$$

where $C(V)$=junction capacity value shown as a function of voltage (microfarads)

$C_0$=junction capacitance at $(V_0+\phi)$ equals one volt (microfarads)

$V_0$=total applied voltage across the varactor (volts)

$\gamma$=non-linear coefficient=gamma coefficient $\phi$=contact potential of the junction (volts)

(b) means for coupling power at said first frequency individually to said first and second diodes, (c) means for coupling power at said second frequency and at said interfering frequency individually to said first and second diodes, causing mixing by said diodes of said first and second frequencies, (d) output means coupled to said first and second diodes for deriving an output signal of desired frequency from said diodes, (e) the gamma coefficient $\gamma 1$ of said first diode and the different gamma coefficient $\gamma 2$ of said second diode being determined to cause said diodes to produce said output signal at said output means substantially free of even order harmonics and distortion products of said interfering frequency.

6. A mixer for deriving beat frequency signal currents from two sources of alternating current having a frequency difference comprising (a) a waveguide having a signal input end, said waveguide branching into two smaller waveguides, (b) a first varactor diode positioned in one of said smaller waveguides and having a gamma coefficient of $\gamma 1$, where gamma coefficient $(\gamma)$ is defined by the formula $$C(V)=\frac{C_0}{(V_0+\phi)}\gamma \qquad (1)$$

where

C(V)=junction capacity value shown as a function of voltage (microfarads)

$C_0$=junction capacitance at $V_0+\phi$ equals one volt (microfarads)

$V_0$=total applied voltage across the varactor (volts)

$\gamma$=non-linearity coefficient=gamma coefficient $\phi$=contact potential of the junction (volts)

(c) a second varactor diode positioned in the second one of said smaller waveguides and having a different gamma coefficient of $\gamma 2$, (d) means for applying a reference potential to each of said varactors, (e) means for launching from a first source of alternating current a signal wave of a first frequency at said input end and therefrom into said smaller waveguides, (f) means for launching from a second source of alternating current a second wave of a second frequency into each of said smaller waveguides, (g) means for independently controlling the energy of said second wave in each of said smaller waveguides so that said diodes opearte to produce beat frequency currents of said first and second frequency, (h) output means coupled to said diodes and responsive to said beat frequency currents to provide a desired output signal, (i) the gamma coefficient $\gamma 1$ of said first diode and the different gamma coefficient $\gamma 2$ of said second diode being determined to cause said diodes to produce said output signal at said output means substantially free of even order harmonics and distortion products of said interfering frequency.

7. The mixer as described in claim 6 where said first diode is a hyperabrupt junction varactor diode and said second diode is a graded junction varactor diode.

8. A mixer as claimed in claim 6 where the gamma coefficient of said first diode is less than 0.5, and where the gamma coefficient of said second diode is between 0.5 and 0.667.

References Cited

UNITED STATES PATENTS

| | | | |
|---|---|---|---|
| 2,547,378 | 4/1951 | Dicke | 325—446 |
| 2,943,192 | 6/1960 | Liss | 325—446 |
| 3,063,011 | 11/1962 | Sproul et al. | 325—449 XR |

ROBERT L. GRIFFIN, Primary Examiner

R. S. BELL, Assistant Examiner

U.S. Cl. X.R.

325—450; 332—43